United States Patent [19]
Vu

[11] Patent Number: 4,922,315
[45] Date of Patent: May 1, 1990

[54] CONTROL GATE LATERAL SILICON-ON-INSULATOR BIPOLAR TRANSISTOR

[75] Inventor: Duy-Phach Vu, Taunton, Mass.

[73] Assignee: Kopin Corporation, Taunton, Mass.

[21] Appl. No.: 120,036

[22] Filed: Nov. 13, 1987

[51] Int. Cl.$^5$ ........................................... H01L 29/72
[52] U.S. Cl. ........................................ 357/35; 357/59; 357/23.1; 357/23.7
[58] Field of Search .................. 357/35, 23.7, 23.14, 357/23.1, 59 H

[56] References Cited

FOREIGN PATENT DOCUMENTS 0052038  5/1982  European Pat. Off. ............. 357/35
0137992  4/1985  European Pat. Off. .
8700030  7/1987  United Kingdom .

OTHER PUBLICATIONS

Sturm et al., "A Lateral Silicon–On–Insulator Bipolar Transistor with a Self-Aligned Base Contact", *IEEE Electron Device Letters*, vol. EDL-8, No. 3, Mar. '87, 194–6.

Tsaur et al., "Fully Isolated Lateral Bipolar-MOS Transistors Fabricated in Zone-Melting-Recrystallized Si Films on SiO$_2$", *IEEE Electron Device Letters*, vol. EDL-4, No. 8, Aug. '83, 269–71.

Rodder et al., "Silicon–On–Insulator Bipolar Transistors", *IEEE Electron Device Letters*, vol. EDL-4, No. 6, Jun. 1983, 193–195.

Colinge, "An SOI Voltage-Controlled Bipolar-MOS Device", *IEEE Transactions on Electron Devices*, vol. ED-34, No. 4, Apr. 1987, 845–849.

"SOI: Electrical Characterization", by D. P. Vu, Jun. 1986, pp. 369–378.

S. M. Sze, "Physics of Semiconductor Devices", *A Wiley-Interscience Publication*, (1981).

M. W. Geis et al., "Use of Zone-Melting Recrystallization to Fabricate a Three-Dimensional Structure Incorporating Power Bipolar and Field-Effect Transistors", *IEEE Electron Device Letters*, vol. EDL-7, No. 1 (Jan. 1986).

J. P. Colinge, "Half-Micrometer-Base Lateral Bipolar Transistors Made in Thin Silicon-On-Insulator Films", (Jun. 1986).

*Primary Examiner*—William Mintel
*Attorney, Agent, or Firm*—Hamilton, Brook, Smith & Reynolds

[57] ABSTRACT

The present invention relates to silicon-on-insulator (SOI) gated lateral bipolar transistors that are CMOS compatible. A method is described wherein a heavily doped region is implanted into the base after gate formation to provide a low resistance path to the base contact. A lightly doped region is also provided underneath the gate to minimize base-collector capacitance.

10 Claims, 3 Drawing Sheets

Fig. B

CONTROL GATE LATERAL SILICON-ON-INSULATOR BIPOLAR TRANSISTOR

BACKGROUND

In comparison to devices in bulk silicon, SOI devices offer improved speed performance resulting from reduced parasitic capacitance, simplified device isolation and design layout, and radiation hardness for space and nuclear applications. Furthermore, because the SOI devices are dielectrically isolated, they are latch up free in CMOS circuits and are useful for high-voltage integrated circuits.

The fabrication of silicon-on-insulator (SOI) lateral bipolar transistors has provided high speed devices for various circuit applications. Bipolar transistors are important for SOI integrated circuit technology since they can handle high frequency switching capabilities. SOI bipolar transistor can have five terminals with n-p-n or p-n-p structures formed on an insulator with a front gate centered above the base and a rear gate using the bulk semiconductive wafer on which the insulator is formed. These devices have been fabricated using standard polysilicon gate CMOS processing and are compatible with SOI-MOS devices.

A SOI bipolar transistor is described in Sturm, James C. et al. "A Lateral Silicon-on-Insulator bipolar transistor With a Self-Aligned Base Contact", IEEE Electron Device Letters, Vol. EDL-8, No. 3, March, 1987.

The fabrication steps of the device described by Sturm et al. above include the recrystallization of polycrystalline silicon film on a thermal oxide layer to form a thin silicon film that is free of subgrain boundaries. The silicon is then uniformly doped with boron and provided with a second heavily doped boron region near the surface. An etching step is used to isolate the gate area as a pedestal.

Arsenic ion implantation and annealing are then used to form the emitter and collector regions on either side of the silicon pedestal in the base.

The heavy doping at the top of the base pedestal serves two purposes. First, it provides a low-resistance ohmic contact. Second, it provides a built-in electric field which repels minority-carriers (electrons) away from the metal base contact. Electrons reaching the base contact would recombine and give rise to base current, not the collector current desired in normal bipolar transistor operation.

There are two problems with this approach, however. First, this approach is specific to this device and is not compatible with CMOS processing. Secondly, there is the absence of a lightly doped collector region. Such a region is necessary for minimizing the base-collector capacitance.

SUMMARY OF THE INVENTION

The present invention overcomes these problems by providing a lateral bipolar device with an isolated gate and utilizing ion implantation into the base region after gate formation. By increasing the access conductivity of the base, the crowding effect is minimized.

The present device is also provided with a lightly doped region underneath the isolated gate and between the base and the collector regions. This gate and the substrate provide control of the energy band bending of the low doped region and thereby permits the setting of the two surfaces of this low doped region under flat-band conditions hence eliminating the effect of oxide and interface charges.

The method for making this device utilizes the gate deposited over the base and the lightly doped region adjacent the base as a mask during implant of the emitter and collector regions.

The method of the present invention has the additional advantage of being compatible with CMOS processing.

The above, and other features of the invention, including various novel details of construction and combination of parts, will now be more particularly described with reference to the accompanying drawings and pointed out in the claims. It will be understood that the particular lateral bipolar transistor embodying the invention is shown by way of illustration only and not as a limitation of the invention. The principal features of this invention may be employed in various embodiments without departing from the scope of the invention.

DETAILED DESCRIPTION OF THE INVENTION

The method of forming the gated bipolar transistor of the present invention is illustrated in FIG. 1.

A silicon wafer 10 is cleaned and a silicon dioxide layer 12 is grown by thermal oxidation to form an insulated substrate. A polysilicon layer is then formed on the insulator typically by standard chemical vapor deposition. The polysilicon can then be recrystallized using non-seeded or seeded moving melt-zone recrystallization to form single crystal silicon. (See U.S. patent application Ser. No. 805,117 filed on Dec. 4, 1985, to Chen et al., entitled "Capping Technique for Zone-Melting Recrystallization of Insulated Semiconductor Films".) The silicon island 14 can be formed by masking the device area and etching the surrounding silicon to the insulating oxide (at A in FIG. 1). Alternatively, the silicon island can be isolated on the wafer by the local oxidation of silicon (LOCOS) planar process. See "Local Oxidation of Silicon: New Technical Aspects" J. A. Appels and M. M. Paffen, Philips Research. Reports Vol. 26, No. 3, pp. 157–165, June 1971.

Although we describe this particular Silicon-on-Insulator (SOI) sample preparation process, other SOI fabrication processes, such as SOI obtained by oxygen high dose implantation will also be applicable to this invention.

Figure 1A:
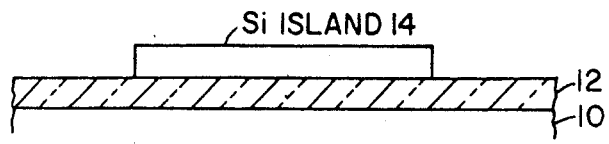
FIG. 1 (A–I) illustrates the steps of the method of forming the gated bipolar transistor of the present invention.

FIG. 1B illustrates how photoresist 16 is formed over about half of the silicon island 14 and a p-type dopant such as boron is implanted into the exposed area to form a lightly doped p-type region with a concentration level of about $1 \times 10^{16}$ cm$^{-3}$.

Figure 1C:
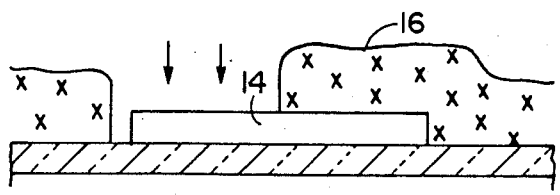
Figure 1C:
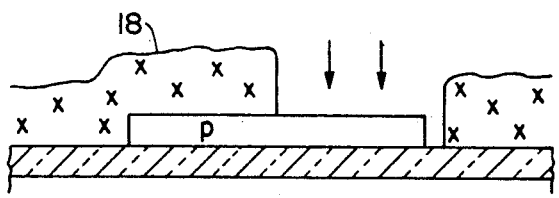

In FIG. 1C a new mask 18 is formed to expose the other half of the silicon island and an n-type dopant such as phophorus is implanted having a concentration of about $1 \times 10^{16}$ cm$^{-3}$.

Figure 1D:
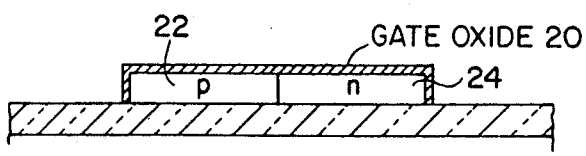

FIG. 1D illustrates the formation of an insulating layer 20 over the exposed surface of the laterally positioned p and n regions 22 and 24, respectively. The layer is preferably silicon dioxide measuring between 200 and 1000 Å.

Figure 1E:
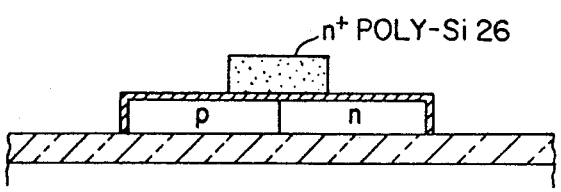

Although any standard conductive gate may be used, the gate 26 of this preferred embodiment is formed, as shown in FIG. 1E, by depositing a poly-silicon layer doped with phosphorus. The gate 26 across the center of the island is then formed by etching the polysilicon layer to form a strip. Gate widths are generally smaller than 10 microns due to specially designed mask sets.

Figure 1F:
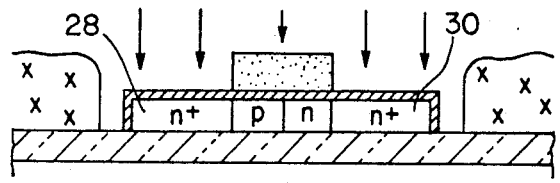

The gate region is then used as a mask as shown in FIG. 1F to aid in the formation of the emitter and collector regions 28 and 30, respectively, which in this embodiment are n+-type, having concentrations on the order of $1 \times 10^{20}$ cm$^{-3}$.

Figure 1G:
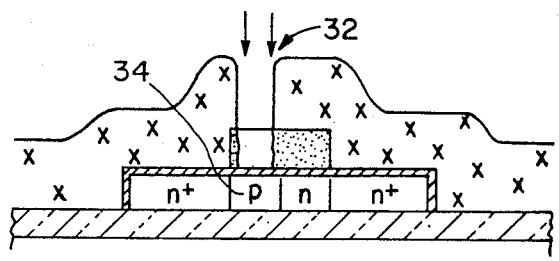

FIG. 1G illustrates the critical step of the present invention wherein a mask is formed over the entire structure except for a narrow window 32 exposing a portion of the gate surface that lies directly above the p-type base region 34 of the transistor. Boron is implanted through the gate structure, and the intervening gate oxide, to form a p+-type zone along the top region of the p-type base. The doping concentration is about $1 \times 10^{19}$ cm$^{-3}$. The implant must be shallow inside the base without contacting the emitter. This heavily doped region 36 provides a low resistance path to the base contact shown in FIG. 2.

Figure 1H:
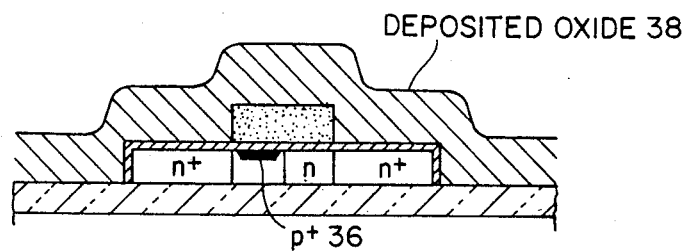
Figure 1I:
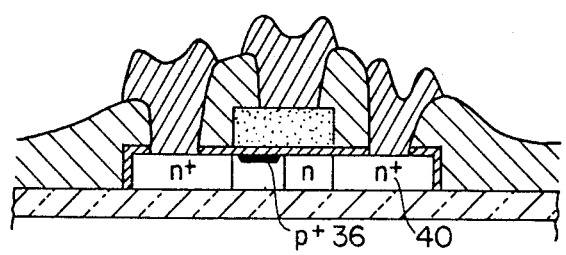

FIG. 1H shows the deposition of a passivating oxide 38 prior to dopant activation and oxide reflow by a high temperature treatment. Windows are then formed through the oxide to contact the emitter, collector, and base regions as well as the MOS polysilicon gate.

The lightly doped n-type region 40 is well known in bulk vertical transistors in minimizing the base-collector capacitance. (See Sze, S. M., *Physics of Semiconductor Devices*, Wiley (2nd Ed.), 1981). However, the previous work on SOI lateral transistors have not utilized the advantages of this structure in minimizing the base-collector capacitance. The present structure thus combines the advantages of the heavy p+ doping at the top of the base and the low doping n region between the base and the collector to improve the gain and speed characteristics of the device. Furthermore, the isolated gate 26 combined with an isolated substrate provide control of the oxide and oxide-silicon interface charge on both sides of the n region.

Figure 2:
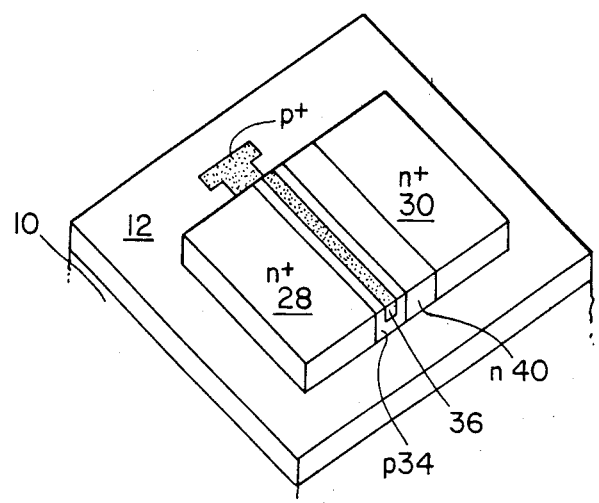
FIG. 2 is a perspective view of the gated bipolar transistor as fabricated after the base contact implant of FIG. 1G.
Figure 3:
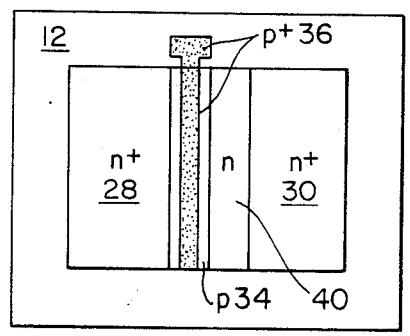
FIG. 3 is a plan view of the device shown in FIG. 2.

FIG. 2 shows in perspective view the highly doped base contact region 36 within the base 34, with overlying insulator and control gate removed for clarity. FIG. 3 is a plan view of the device illustrated in FIG. 2.

I claim:

1. A gated lateral bipolar transistor comprising:
a semiconductor substrate;
an insulator over a surface of said substrate;
a first doped semiconductor region on the insulator having one type of conductivity;
a second doped semiconductor region on the insulator and laterally contacting the first region on one side having an opposite type of conductivity and lower doping concentration relative to the first region;
a third doped semiconductor region on the insulator and laterally contacting the second region on a side opposite the first region having the type of conductivity as the first region and lower doping concentration relative to the first region;
a fourth doped semiconductor region on the and laterally contacting the third region on a side opposite said second region having the same type of conductivity as the first region and the same doping concentration as that of said first region;
an insulating cover on the first, second, third, and fourth semiconductor regions;
a doped semiconductor zone, positioned inside of and along a surface of the second region that contacts the insulating cover, and having the same type of conductivity and a higher doping concentration than the second region such that the zone does not contact the first region; and
a gate region on the insulating cover and positioned over the second and third regions.

2. The bipolar transistor of claim 1 wherein said first, second, third, and fourth regions are comprised of silicon.

3. The gated bipolar transistor of claim 1 wherein said first region has an n type conductivity, said second region has a p type conductivity, said third region has an n type conductivity, said fourth region has an n type conductivity, and said semiconductor zone has a p type conductivity.

4. The gated bipolar transistor of claim 1, wherein said semiconductor substrate is a silicon.

5. The gated bipolar transistor of claim 3 wherein said gate region is comprised of n type polycrystalline silicon.

6. The gated bipolar transistor of claim 1 wherein said insulating cover is comprised of silicon dioxide.

7. The gated bipolar transistor of claim 1 wherein the first region has a p type conductivity, said second region has an n type conductivity, said third region has a p type conductivity, said fourth region has a p type conductivity, and said semiconductor zone has an n type conductivity.

8. The gated bipolar transistor of claim 7 wherein the gate region is comprised of n type polycrystalline silicon.

9. The gated bipolar transistor of claim 1 further comprising a base contact region in conductive contact with the second region.

10. A gated lateral bipolar transistor comprising:
an emitter region of doped semiconductor material of a first conductivity type formed on an insulating substrate;
a base region of doped semiconductor material of a second conductivity type formed on the insulating substrate contacting the emitter region;
a first collector region of doped semiconductor material of said first conductivity type on the insulating substrate and contacting the base region;
a second collector region of semiconductor material of said first conductivity type, having a higher doping level than the first region, the second region being formed on the insulating substrate in contact with the first region;
an insulator extending over the emitter, the base and the first and second collector regions;
a base contact within the base region underlying the insulator and in conductive contact with the base region such that the base contact has the same conductivity type and a higher doping concentration as that of the base region and
a control gate extending over the insulator and the first collector region to control an electric field in the first region.

* * * * *